(12) United States Patent
Hamouche et al.

(10) Patent No.: US 8,477,540 B2
(45) Date of Patent: Jul. 2, 2013

(54) STATIC MEMORY DEVICE WITH FIVE TRANSISTORS AND OPERATING METHOD

(75) Inventors: Lahcen Hamouche, Grenoble (FR); Jean-Christophe Lafont, Meylan (FR)

(73) Assignee: STMicroelectronics (Tours) SAS, Tours (FR)

( * ) Notice: Subject to any disclaimer, the term of this patent is extended or adjusted under 35 U.S.C. 154(b) by 342 days.

(21) Appl. No.: 12/842,618

(22) Filed: Jul. 23, 2010

(65) Prior Publication Data

US 2011/0026314 A1    Feb. 3, 2011

(30) Foreign Application Priority Data

Jul. 28, 2009  (FR) ...................................... 09 55274
Jan. 26, 2010  (FR) ...................................... 10 50487

(51) Int. Cl.
*G11C 7/10*    (2006.01)

(52) U.S. Cl.
USPC ................. 365/189.05; 365/156; 365/189.17

(58) Field of Classification Search
USPC ............................... 365/156, 189.17, 189.05
See application file for complete search history.

(56) References Cited

U.S. PATENT DOCUMENTS

| | | | | |
|---|---|---|---|---|
| 5,455,795 | A * | 10/1995 | Nakao et al. | 365/189.05 |
| 6,034,886 | A * | 3/2000 | Chan et al. | 365/154 |
| 6,173,379 | B1 | 1/2001 | Poplingher et al. | |
| 7,310,281 | B1 * | 12/2007 | Hsueh et al. | 365/222 |

OTHER PUBLICATIONS

Hamouche, Allard; "PORTLESS low power mux architecture with line hard duplication"; IEEE Conference Publications, International Memory Workshop; May 16-19, 2010.*
Hamouche, Allard; "SRAM Portless bitcell and current-mode reading", Feb. 2010, IEEE Conference Publications, Int'l Symposium on Circuits and Systems (ISCAS), pp. 3865-3868; 2010.*
Wieckowski et al.; "A 128kb High Density Portless SRAM Using Hierarchical Bitlines and Thyristor Sense Amplifiers"; IEEE Conference Publications, 12$^{th}$ Int'l Symposium on Quality Electronic Design (ISQED); 2011.*
Wieckowski, M., et al., "A Portless SRAM Cell Using Stunted Wordline Drivers," IEEE 2008, pp. 584-587.
Wieckowski, M., et al., "Portless SRAM—A High-Performance Alternative to the 6T Methodology," IEEE Journal of Solid-State Circuits, vol. 42, No. 11, 10 pages.
Wiekowski, M., et al., "A Novel Five-Transistor (5T) SRAM Cell for High Performance Cashe," IEEE, 2005, pp. 101-102.
Iljima, M., et al., "Ultra Low Voltage Operation with Bootstrap Scheme for Single Power Supply SOI—SRAM," IEEE, 6$^{th}$ International Conference on VLSI Design (VLSID '07), 6 pages.
Wang, J-S, et al., "Low Power Embedded SRAM with the Current-Mode Write Technique," IEEE, Journal of Solid State Circuits, vol. 35, No. 1, Jan. 2000, pp. 119-124.

* cited by examiner

*Primary Examiner* — Hoai V Ho
*Assistant Examiner* — Jay Radke
(74) *Attorney, Agent, or Firm* — Slater & Matsil, L.L.P.

(57) ABSTRACT

At the bottom of a column (COLi) of memory cells (CEL) of the SRAM type with five portless transistors, there is placed an additional cell (CLS), with a structure identical to the cells (CEL), which makes it possible to write and read a datum in a memory cell (CEL) of the column without using a read amplifier.

17 Claims, 12 Drawing Sheets

STATIC MEMORY DEVICE WITH FIVE TRANSISTORS AND OPERATING METHOD

This application claims priority to French Patent Application No. 09-55274, which was filed Jul. 28, 2009 and French Patent Application No. 10-50487, which was filed Jan. 26, 2010 both of which are incorporated herein by reference.

TECHNICAL FIELD

The invention relates to integrated circuits, and more particularly static memory devices, of the SRAM (Static Random Access Memory) type, with five transistors, said to be "portless," also commonly referred to by those skilled in the art as "portless SRAMs."

BACKGROUND

The memory cells of the portless, five-transistor SRAM type are well known to those skilled in the art. Notably worth citing is the article by Michael Wieckowski and Martin Margala entitled "Portless SRAM—A High-Performance Alternative to the 6T Methodology," IEEE Journal of Solid-State Circuits, Volume 42, No. 11, November 2007, or the article by these same authors entitled "A Portless SRAM Cell Using Stunted Wordline Drivers," IEEE 2008, pages 584-587.

A memory cell of the portless SRAM type is, as diagrammatically illustrated in FIG. 1, based on the principle of two inverters INV1, INV2, cross-coupled and powered by two portless bit lines BLTP and BLFP, such as, for example, NMOS transistors.

Furthermore, the SRAM cell comprises a fifth transistor, called "access transistor," AXS, connected as illustrated in FIG. 1.

FIG. 2 illustrates a more detailed, but still diagrammatic, representation of the cell of FIG. 1, in which the transistors of the inverters are represented. More specifically, the cell CEL effectively comprises five transistors, namely two pairs of PMOS and NMOS transistors forming the two inverters, and the fifth transistor AXS. FIG. 2 shows that the source of the PMOS transistor M1 is connected to the bit line BLTP, whereas the source of the PMOS transistor M3 is connected to the line BLFP. The drains of these two transistors M1 and M3 are respectively connected to the drains of the two NMOS transistors M2 and M4. The sources of these two transistors M2 and M4 are connected to the ground.

Moreover, the gates of the four transistors M1-M4 are cross-coupled. Finally, the access transistor AXS, which is in this case an NMOS transistor, is connected between the gates of the PMOS transistors M1 and M3. That said, this transistor AXS could be a PMOS transistor.

A datum, comprising two complementary logic values 1, 0 or 0, 1, is stored between the two output nodes T and F of the two inverters. For example, the two nodes T and F of the two inverters may store 1 and 0, respectively, or 0 and 1, respectively.

When the access transistor AXS is opened (blocked or OFF), the cell CEL is stable and the datum is kept in that cell as long as the cell remains powered by the power supply voltage. When the access transistor AXS is closed (passing or ON), a current flows from the node T or F presenting the logic value 1 to the node F or T presenting the logic value 0.

A portless, five-transistor SRAM cell is therefore an alternative to the conventional six-transistor SRAM cells, that is to say with two inverters connected to the two bit lines by two ports, such as NMOS transistors.

To write a datum into the cell CEL, the two bit lines are first of all precharged at the power supply voltage, the transistor AXS is closed and the voltage of one of the bit lines is made to drop depending on whether the desire is to write a 1 or a 0, so as to provoke a voltage difference between the nodes T and F of the cell.

Once the datum is written, the transistor AXS is reopened and the precharging provides the cell power supply necessary for the datum to be retained.

To read the datum from the cell CEL, the transistor AXS is closed. A current difference is then created between the two bit lines, the sign of which depends on the logic value of the stored datum. This current difference is amplified conventionally in a current amplifier located at the bottom of the column of the memory plane containing the cell, and the datum is thus read.

Such a conventional column of portless, five-transistor SRAM memory cells presents a certain number of drawbacks.

More specifically, during a write operation, the voltage difference between the two bit lines must be sufficiently great to allow the cell to be written to change state, without, however, affecting the stability of the other cells of the same column, since all the cells of the column are powered by these bit lines.

Moreover, during a read operation, the cell read must induce a current difference between the two bit lines that is great enough to be located outside the "offset" of the current amplifier situated at the bottom of the column.

Now, all these constraints are generally incompatible with advanced technologies in which the power supply voltage is relatively low, for example the 45 nanometre technologies in which the power supply voltage is 1.1 volt.

SUMMARY OF THE INVENTION

In one aspect the present invention provides for an SRAM-type memory device, the device comprising a memory plane having at least one column of memory cells of the SRAM type. Each memory cell comprises two cross-coupled inverters and a single access transistor, each memory cell being connected between two bit lines without access transistors between the two bit lines and the memory cell. The at least one column of the memory plane also comprises an additional memory cell, with a structure identical to the memory cells of said column, connected to the two bit lines, the two bit lines being configured to be powered by a power supply voltage. The device further includes a controllable additional access means connected to said additional memory cell and having a first state to prevent access to said additional cell and a second state to allow access to said additional memory cell so as to store a datum therein or extract a datum therefrom. The device further includes a first control means configured to place said additional access means in said first or in said second state and a second control means configured to deliver, when the additional access means is in said first state, a first control signal to a gate of the access transistor of one of the memory cells of the column and a second control signal to a gate of the access transistor of the additional memory cell so as to place said memory cell in a read mode and the additional memory cell in a write mode, or vice versa.

In another aspect, the present invention provides for an SRAM-type memory device, comprising a memory plane having at least one column of memory cells of the SRAM type comprising two cross-coupled inverters and a single access transistor, each memory cell being connected between two bit lines without access transistors between the two bit lines and the memory cell, wherein the two bit lines are configured to be powered by a power supply voltage. The device includes a control means configured to deliver a first control signal to the gate of the access transistor of a first memory cell of the column and a second control signal to the gate of the access transistor of a second memory cell of the column so as to place said first memory cell in a read mode and said second memory cell in a write mode, or vice versa.

In yet another aspect, the present invention provides for a method of reading a datum from or writing a datum to a memory cell of a device, the memory cell being connected between two bit lines without access transistors between the two bit lines and the memory cell. The device includes an additional memory cell with a structure identical to the memory cell and also connected to the two bit lines and further includes a memory access means and an additional memory access means. The method comprises connecting the two bit lines to a power supply voltage, placing the additional memory access means of the additional memory cell in a first state, placing the memory cell in a read mode, placing the additional memory cell in a write mode, writing the opposite of the datum contained in said memory cell into said additional memory cell, placing the additional memory access means in a second state, and extracting said opposite datum from said additional memory cell.

In yet another aspect, the present invention provides for a method of reading or writing a group of data contained in a selected line of memory cells of a block of a device having a memory plane of p blocks of m columns of n/p lines of memory cells, each memory cell being connected between two bit lines, each column including an additional memory cell, a second additional memory cell, an additional access means, two additional bit lines, a terminal additional memory cell, and a terminal additional access means. The method includes connecting the two bit lines of each column to a power supply voltage, placing additional access means of each additional memory cell of said block in a first state, placing each memory cell of said selected line in a read mode, placing each additional memory cell in a write mode, the opposite of the datum contained in each memory cell being written into the corresponding additional memory cell, placing said additional access means in a second state, connecting the two additional bit lines of each column to said power supply voltage, placing each additional memory cell of said block in a read mode, placing each second additional memory cell associated with said block in a write mode, the opposite of the datum contained in each additional memory cell being written into the corresponding second additional memory cell, placing said additional access means and the terminal additional access means in a first state, placing each second additional memory cell associated with said block in a read mode, placing each terminal additional memory cell in write mode, the opposite of the datum contained in each second additional memory cell being written into the corresponding terminal additional memory cell; and placing the terminal additional access means in a second state and extracting said datum contained in each terminal additional memory cell.

In yet an additional aspect, the present invention provides for a method of copying the content of a first line of a memory plane into a second line of the memory plane, the memory plane having at least one column of memory cells of the SRAM type comprising two cross-coupled inverters and a single access transistor, each memory cell being connected between two bit lines without access transistors between the two bit lines and the memory cell, and having a control means configured to deliver a first control signal to a gate of the access transistor of a first memory cell of the column and a second control signal to a gate of the access transistor of a second memory cell of the column. This method includes connecting the bit lines of each column to a power supply voltage, and placing the memory cells of a first line of the column in a read mode and placing the memory cells of a second line in the column in a write mode.

BRIEF DESCRIPTION OF THE DRAWINGS

Other benefits and characteristics of the invention will become apparent from examining the detailed description of embodiments and implementations that are by no means limiting, and the appended drawings, in which.

DETAILED DESCRIPTION OF ILLUSTRATIVE EMBODIMENTS

Figure 1:
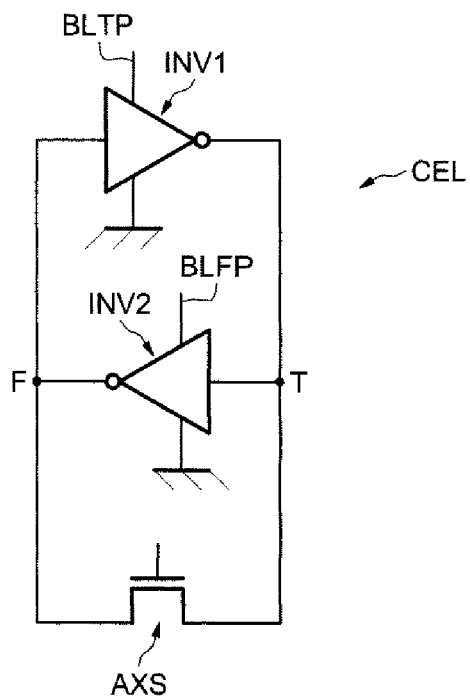
FIGS. 1 and 2, already described, diagrammatically illustrate a portless, five-transistor SRAM memory cell according to the prior art.

Before addressing specific embodiments in detail, a brief overview of the various embodiments, and potential advantages thereof, is provide. According to one embodiment, there is proposed a portless, five-transistor SRAM-type memory device that makes it possible to do away with the use of a current amplifier at the bottom of the column. There is also proposed, in particular, a dynamic current memory device, and therefore one with lower consumption. It is also proposed, in particular, to perform the write and read operations in the cells by means of a current, which does not require the charging and discharging of the bit lines in the write operations.

According to some illustrative embodiments, an SRAM-type memory device comprises a memory plane having at least one column of memory cells of the SRAM-type comprising two cross-coupled inverters and a single access transistor, each memory cell being connected between two lines of bits without access transistor between the two lines of bits and the memory cell. According to a general characteristic of these embodiments, each column of the memory plane also comprises an additional cell, with a structure identical to the memory cells of said column, this additional cell also being connected to the two lines of bits. The two lines of bits are designed to be powered by a power supply voltage and the memory device also comprises additional access means, for example controllable NMOS transistors, connected to said additional cell and having a first state to prevent access to said additional cell and a second state to allow access to said additional cell so as to store a datum therein or extract a datum therefrom.

The illustrative device also comprises first control means configured to place the additional access means in their first or in their second state. The illustrative memory device also comprises second control means configured to deliver, when the additional access means are in their first state, a first control signal to the gate of the access transistor of one of the memory cells of the column and a second control signal to the gate of the access transistor of the additional cell so as to place said memory cell in a read mode and the additional memory cell in a write mode, or vice versa.

Thus, an additional cell, situated, for example, at the bottom of the column, identical to the cells of the column, makes it possible to perform both read operations and write operations in a selected memory cell of the column. Its role is simply inverted between a read operation and a write operation. More specifically, when a cell that has to be read is placed in its read mode, the additional cell is placed in its write mode, which will make it possible to copy the opposite (the logical complement) of the datum contained in the cell to be read. On the other hand, when a datum has to be written into a cell of the column, the additional cell is then placed in the read configuration, which will make it possible to copy the opposite of the datum that it contains into the cell of the column that has to be written. This therefore makes it possible to do away with a current amplifier and therefore the "offset" problems that are associated therewith.

There is a low dynamic consumption since the currents for reading the cell of the column that has to be read are used to write into the additional cell. Finally, there is no need for the charging and discharging of the bit lines in each write operation in a cell of the column.

According to one embodiment, the second control means are configured to deliver, to the gate of the access transistor of the memory cell, a first voltage as a first control signal so as to render this access transistor passing; the second control means are also configured to deliver, to the gate of the access transistor of the additional memory cell, a second voltage as a second control signal so as to render this access transistor passing; the first voltage is less than the second voltage so as to place the memory cell in the read mode and the additional memory cell in the write mode; on the other hand, the first voltage is greater than the second voltage, so as to place the memory cell in the write mode and the additional memory cell in the read mode.

This difference between the two voltages, applied to the access transistors of the memory cell of the selected column and of the additional memory cell, makes it possible to effectively place one of the cells in read mode and the other in write mode, or vice versa, and thus avoid uncertainty in the behaviour of each of the two cells.

So as to correct the dispersions associated with the technology, notably with regard to PMOS transistors that are faster or slower than NMOS transistors, and also so as to be able to deliver, in a simple manner, the first and second control voltages for the access transistors, provision is advantageously made for the second control means to comprise control modules respectively associated with the memory cells of the column and with the additional memory cell; each control module comprises, for example, a port connected between the power supply voltage and the ground, the output of this port being connected to the gate of the access transistor of the corresponding memory cell, and the gates of the two transistors of the port being respectively controlled by a read logic signal and a write signal; the control module also comprises a charging pump connected between the power supply voltage and the gate of the access transistor via an auxiliary transistor, controlled on its gate by the write logic signal.

Such an embodiment thus makes it possible, in a very simple manner, to deliver, to the gate of the access transistor of a memory cell, a voltage less than the power supply voltage when this cell has to be in read mode, and to deliver, to the gate of this access transistor, a voltage greater than the power supply voltage when this cell has to be in write mode.

Moreover, so as to further enhance the operation of the memory device, and have a differential that is big enough to allow a cell to change state during a write operation, provision is advantageously made for each inverter of a memory cell, and for each inverter of the additional memory cell, to be connected between one of the two bit lines and another bit line designed to be connected to the ground.

According to another aspect, there is proposed a method of reading a datum contained in a memory cell of a memory device as defined hereinabove, the method comprising a connection of the two lines of bits to said power supply voltage, the placing of the additional access means of the additional memory cell in their first state, the placing of the memory cell in its read mode, the placing of the additional memory cell in its write mode, the opposite of the datum contained in said memory cell being written into the additional memory cell, the placing of the additional access means in their second state, and the extraction of said opposite datum from said additional memory cell.

According to another aspect, there is proposed a method of writing a datum into a memory cell of a device as defined hereinabove, comprising a connection of the two lines of bits to said power supply voltage, the placing of the additional access means of the additional memory cell in their second state, the storage of said datum in the additional memory cell, the placing of the additional access means in their first state, the placing of the memory cell in its write mode, the placing of the additional memory cell in its read mode, the opposite of the datum contained in said additional memory cell being written into the memory cell. These features will be better understood with reference to the following detailed description of illustrative embodiments.

Figure 2:
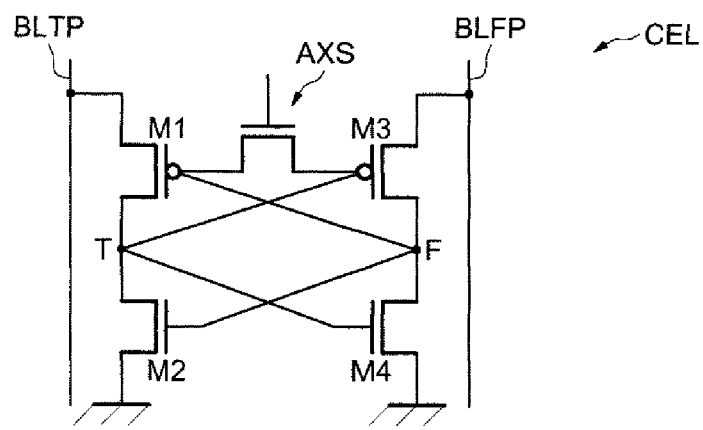
Figure 3:
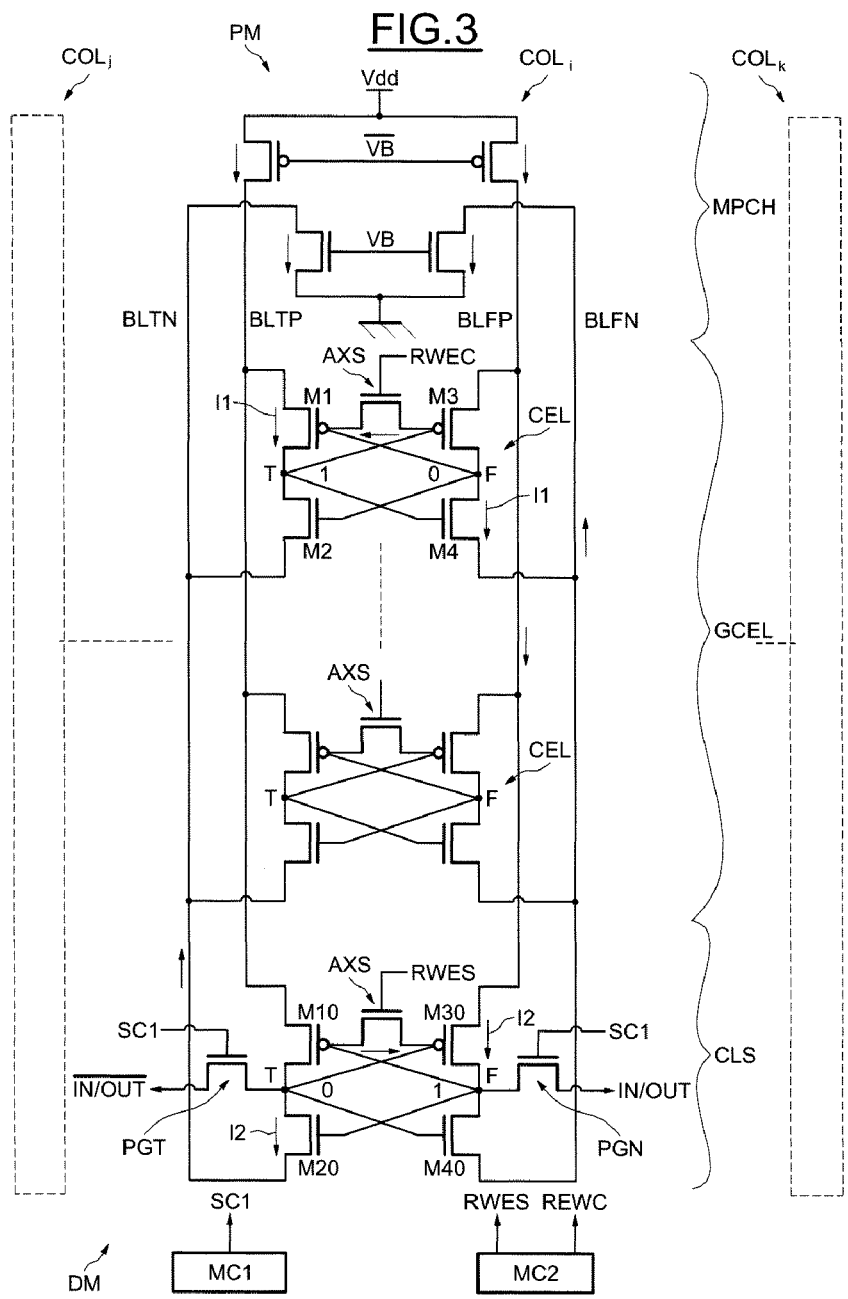
FIG. 3 diagrammatically illustrates an embodiment of a memory device according to an embodiment of the invention.

In FIG. 3, a memory device DM comprises a memory plane PM with a matrix array of memory cells CEL of the portless, five-transistor SRAM type, such as that illustrated, for example, in FIG. 2. The memory plane PM consequently comprises lines of memory cells and columns COL of memory cells CEL.

Only the column COLi is illustrated in detail, the structure of the other columns COLj, COLk being identical to that of the column COLi.

As illustrated in FIG. 3, each memory cell CEL of the column COLi is connected to the two bit lines BLTP and BLFP. These two bit lines are intended for connection to the power supply voltage Vdd via means MPCH comprising, in this example, two PMOS transistors with their gates controlled by a logic signal $\overline{VB}$.

Moreover, the sources of the transistors M2 and M4 of each of the cells CEL are respectively connected to two other bit lines BLTN and BLFN intended for connection to the ground, also via the means MPCH, also comprising, in this respect, two NMOS transistors controlled by the logic signal VB.

In addition to the group GCEL of memory cells CEL of the column, this column also comprises an additional memory cell CLS with structure identical to a memory cell CEL of the group GCEL. This additional memory cell CLS is therefore also a static, portless, five-transistor memory cell between the bit lines. In other words, as for the other memory cells, the sources of the PMOS transistors M10 and M30 of the additional cell CLS are directly connected to the two portless bit lines BLTP and BLFP.

Moreover, the sources of the NMOS transistors M20 and M40 of the additional cell CLS are also connected in this example to the two other bit lines BLTN, BLFN.

There are also provided additional access means PGT, PGN connected to the two output nodes T and F of the two inverters of the additional cell CLS. These additional access means PGT and PGN in this case comprise two NMOS transistors respectively controlled on their gate by a control signal SC1.

This control signal SC1, depending on its value, will make it possible to render the transistors PGT and PGN passing or blocked so as to allow access to the additional cell CLS in order to store a datum therein, or extract a datum therefrom.

The control signal SC1 is delivered by first control means MC1 that can be implemented conventionally and in a manner known per se, for example by logic circuits.

The access transistor AXS of each cell CEL of the group of memory cells GCEL is controlled on the gate by a second control signal RWEC which is in fact a voltage delivered to the gate of this access transistor AXS.

Similarly, the gate of the transistor AXS of the additional cell CLS receives a voltage RWES as second control signal.

Figure 4:
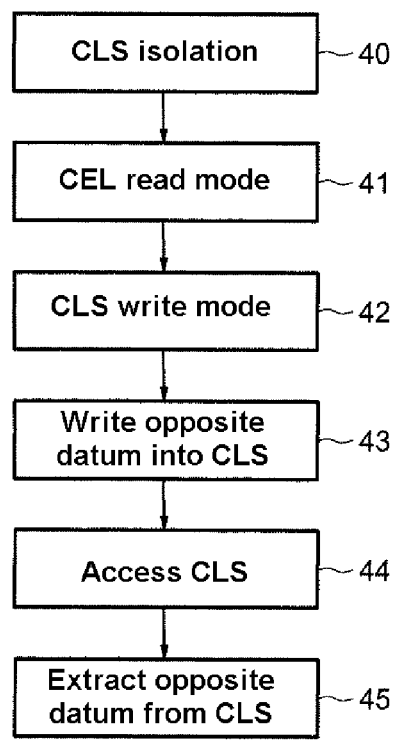
FIGS. 4 and 5 respectively illustrate the main steps in implementing a reading and a writing of a datum in a memory cell of a column of the memory plane of a memory device according to an embodiment of the invention.

Reference is now made more particularly to FIG. 4 to describe an implementation of a method of reading a datum contained in a memory cell CEL of the column COLi. It is assumed, in the example described here and illustrated in FIG. 3, that a logic "1" is stored in the cell CEL, characterized for example by the presence of a "1" on the node T and of a "0" on the node F.

The cell CLS is isolated from the outside by the transistors PGT and PGN, which are blocked (step 40, FIG. 4).

The bit lines BLTP and NLFP are connected to the voltage Vdd via means MPCH (logic signal VB=1) whereas the other bit lines BLTN and BLFN are connected to the ground via means MPCH (logic signal VB=1).

The voltage RWEC, which is in this case a fraction of the power supply voltage Vdd (for example a fraction between 70 and 85% of this power supply voltage), is applied to the gate of the transistor AXS of the cell CEL (step 41).

In parallel, a voltage RWES that is equal to or preferably greater than the voltage Vdd is applied to the gate of the transistor AXS of the cell CLS (step 42).

The result of this is, therefore, that the cell CLS is less stable than the cell CEL. In other words, the cell CLS is in a write mode whereas the cell CEL is in a read mode. Because of this, as illustrated in FIG. 3, the direction of the current flowing in the transistor AXS (which is passing) of the cell CEL is opposite to the direction of the current passing through the transistor AXS of the cell CLS.

As in the example illustrated, the node T of the cell CEL is the high node relative to the node F which is the low node, a read current I1 circulates in the cell CEL as illustrated in FIG. 3.

From this read operation, there is therefore created a current differential in the bit lines BLTP and BLFP.

The cell CLS, less stable than the cell CEL, will consequently induce a current of opposite direction that will circulate in the bit lines BLTN and BLFN so as to compensate this current difference.

Also, the current I2 circulating in the cell CLS will make it possible to copy into the cell CLS the opposite of the datum that was stored in the cell CEL (step 43). In other words, the high node of the cell CLS is, here, the node F, whereas the low node is the node T.

The signal SC1 is then delivered to the gate of the transistors PGT and PGN so as to render these transistors passing (step 44), and the opposite datum, stored in the cell CLS, is extracted therefrom.

This opposite datum is, for example, stored in conventional means that are known per se, for example a latch.

To write a datum into the cell CEL of the column COLi, the roles of the cells CEL and CLS are reversed.

Figure 5:
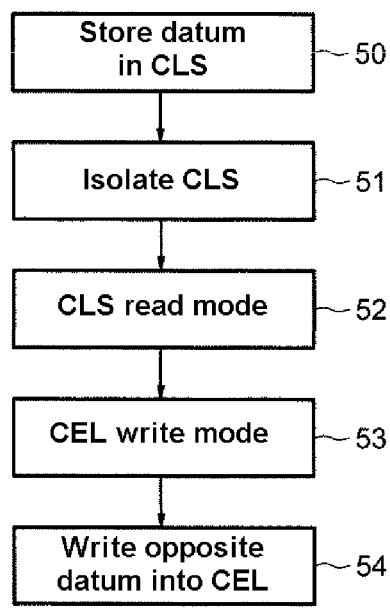

This is illustrated in particular in FIG. 5.

The first step is to store the datum that is to be written into the cell CEL, in the cell CLS. For this, the transistors PGT and PGN are rendered passing via control signals SC1, and the datum is stored in the cell CLS. It is assumed, for example, that, as illustrated in FIG. 3, a "1" is to be stored in the node F and a "0" in the node T.

Then, the cell CLS is isolated from the outside by opening (blocking) the transistors PGT and PGN.

Next, the bit lines BLTP and BLFP being powered by the voltage Vdd and the bit lines BLTN and BLFN being coupled to the ground, a voltage RWES is applied to the gate of the transistor AXS of the cell CLS so as to place this cell CLS in its read mode, and a voltage RWEC is applied to the gate of the transistor AXS of the cell CEL so as to place it in its write mode.

In this configuration, the voltage RWES is this time less than the voltage RWEC. The voltage RWES is thus a fraction of the voltage Vdd whereas the voltage RWEC is this time equal to or preferably greater than the voltage Vdd.

It is therefore this time the cell CEL which is the less stable. The mechanism described hereinabove for writing into the cell CLS is this time the one used for writing into the cell CEL.

At the end of the operation, the datum that is opposite to that contained in the cell CLS is copied (written) into the cell CEL (step 54).

The fact that, internally, there is a change of logic value between the datum copied from a cell CEL into the additional cell CLS and vice versa is unimportant. In practice, ultimately, the correct datum will be retrieved. In practice, if a "1" is to be written into the cell CEL, a "1" will be stored in the cell CLS. Then, a "0" will be copied into the cell CEL. However, when the cell CEL is read, it will in fact be a "1" that is copied into the cell CLS, which will then be extracted from this cell CLS by the additional access means PGT and PGN. Also, the "1" value that was to be stored will ultimately be restored.

It can therefore be seen that the read and write operations are performed with the same circuit, namely the additional cell CLS, without the need to use a current amplifier, which resolves the problem of offsets.

Moreover, the current for reading a cell is used to write into the additional cell and vice versa, which leads to a lower dynamic consumption. Finally, there is no charging or discharging of the bit lines in each write operation.

In the example that has just been described, two other bit lines BLTN and BLFN that are pulled to the ground were preferentially used. That said, it would be possible not to use these additional bit lines and to simply connect the transistors M2 and M4 of each of the cells CEL, as well as the transistors M20 and M40 of the additional cell, to the ground. Nevertheless, the use of the additional bit lines BLTN and BLFN makes it possible to further promote the change of state of the cell CLS or of the cell CEL in the write mode.

It has been seen hereinabove that it was preferable to apply a voltage less than the power supply voltage Vdd, for example a fraction of this power supply voltage, to the gate of the transistor AXS of a cell when the desire was for this cell to be in read mode, whereas it was preferable to apply to the gate of the transistor AXS of this cell a higher voltage, for example a voltage equal to or greater than the power supply voltage Vdd, when the desire was for this cell to be in write mode.

Figure 6:
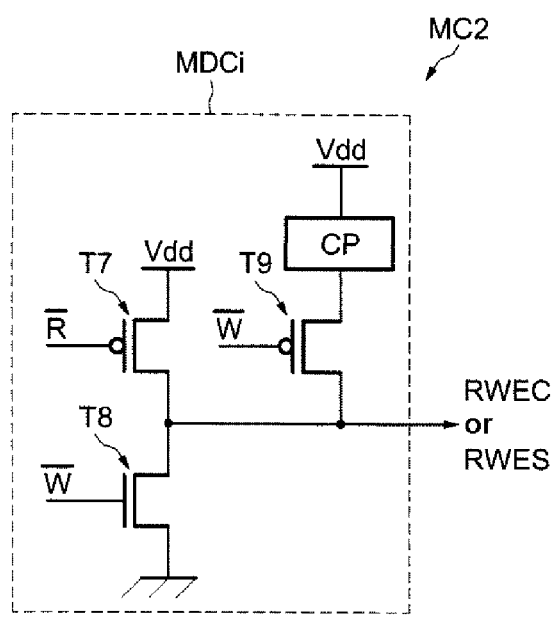
FIG. 6 illustrates, diagrammatically but in more detail, a part of the control means of a memory device according to an embodiment of the invention, and FIGS. 7 to 14 diagrammatically illustrate other embodiments and implementations of the invention.

In these conditions, it is advantageously possible to use, for each of the cells CEL or CLS, a control module MDCi such as that illustrated in FIG. 6. The set of modules MDCi forms the second control means MC2.

This control module MDCi comprises a port connected between the power supply voltage Vdd and the ground, and comprising a PMOS transistor T7 and an NMOS transistor T8. The output of this port is linked to the gate of the transistor AXS of the corresponding cell.

The gate of the PMOS transistor T7 is controlled by a read logic signal $\overline{R}$ whereas the gate of the NMOS transistor T8 is controlled by a write logic signal $\overline{W}$.

The module MDCi also comprises, in this example, a charging pump circuit CP with a conventional structure that is known per se, connected between the power supply voltage Vdd the gate of the access transistor AXS of the corresponding cell via a PMOS transistor T9 controlled on its gate by the logic signal $\overline{W}$.

Thus, when the cell is to be read, the logic value "1" is assigned to the signal R and the logic value "0" to the signal W. The transistors T7 and T8 are consequently passing, the transistor T9 is blocked, and the result of this is therefore that the voltage RWEC or RWES is less than the voltage Vdd.

When the cell is to be written, the logic value "1" is assigned to the signal W and the logic value "0" to the signal R, which renders the transistor T9 passing, the transistors T7 and T8 blocked, and supplies a voltage RWEC or RWES greater than the voltage Vdd.

Moreover, the port T7, T8 makes it possible to compensate the technological dispersions associated with the fabrication of the transistors AXS. In practice, it is well known that some transistors can be faster than others. Also, the port thus makes it possible to compensate the fast or slow nature of these transistors in read mode.

More specifically, if the configuration is a technological configuration in which the NMOS transistors are fast and the PMOS transistors are slow, the voltage RWEC or RWES delivered at the output of the port will drop more strongly than if the NMOS and PMOS transistors had the same speed, because the transistor T8 is faster than the transistor T7. However, since the transistor AXS is an NMOS transistor, and therefore fast, this speed is compensated by the abovementioned voltage drop.

On the other hand, if the configuration is a technological configuration in which the NMOS transistors are slow and the PMOS transistors are fast, the voltage RWEC or RWES delivered at the output of the port will drop less strongly than if the NMOS and PMOS transistors had the same speed because the transistor T7 is faster than the transistor T8. However, since the transistor AXS is an NMOS transistor, and therefore slow, this slowness is compensated by the abovementioned voltage drop.

In the embodiment of FIG. 6, the second power supply means delivering the voltage of a value greater than Vdd comprise the power supply voltage Vdd and a charging pump circuit. That said, the second power supply means could comprise solely a specific external power supply then directly supplying this voltage with a value greater than Vdd.

Figure 7:
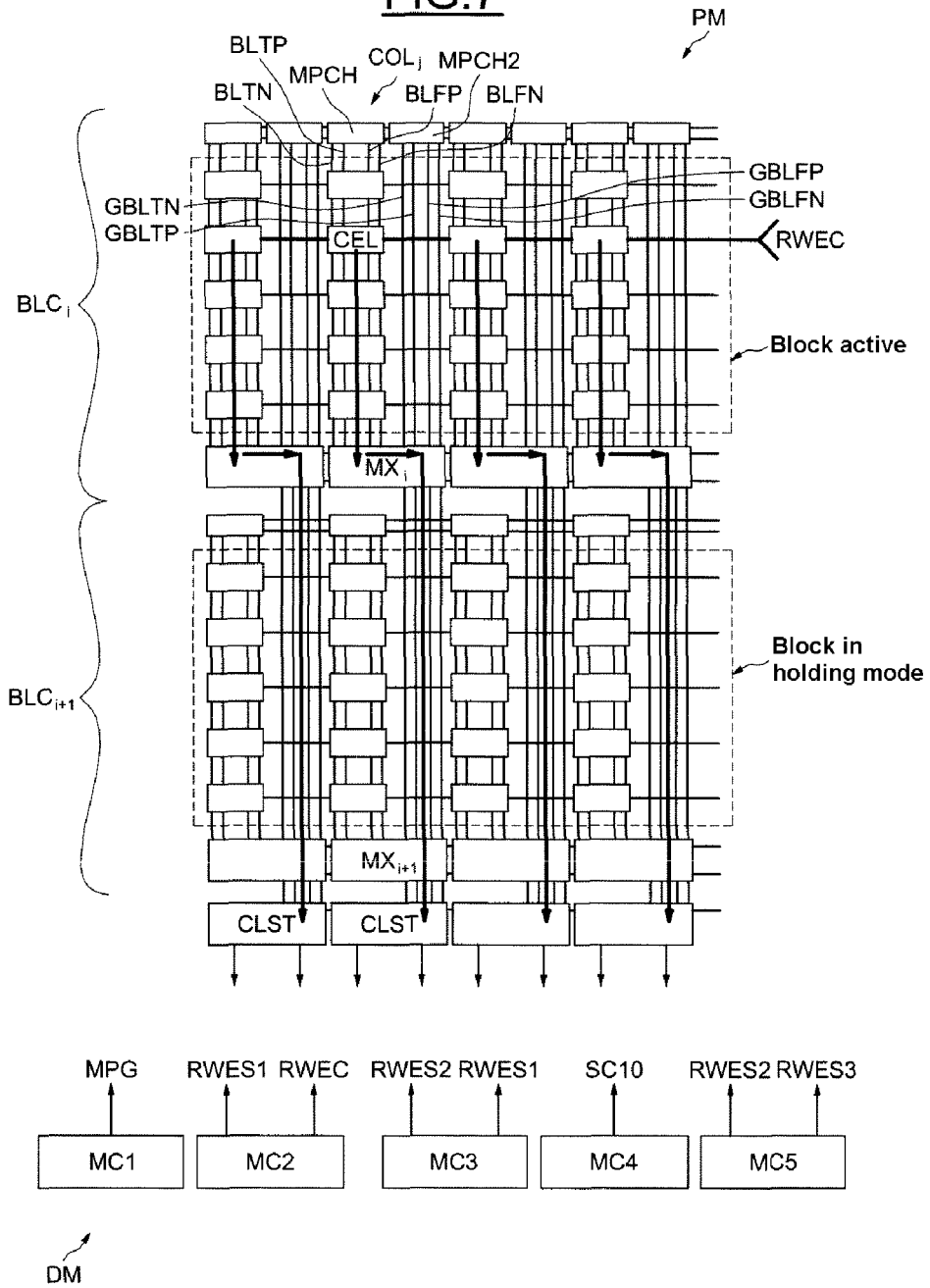

In the embodiment illustrated in FIG. 7, the memory plane (PM) comprises p blocks $BLC_i$ of m columns and of nip lines. It is thus possible to store n digital words each of m bits. Each word is stored in a line of memory cells.

Each column $COL_j$ of a block has a structure identical to that described with reference to FIG. 3.

More specifically, each column comprises, as will be seen in more detail hereinbelow, said additional memory cell connected to the lines of bits of the column, in this case the two bit lines BLTP and BLTN and the two other bit lines BLFP and BLFN.

This additional memory cell is contained in the module $MX_i$ positioned at the end of the column.

The means MPCH of precharging the bit lines are positioned at the other end of the column.

The memory plane also comprises m pairs of additional lines of bits, commonly referred to by those skilled in the art as "global bit lines," each pair of additional lines being associated with the p peer columns of the p blocks. Columns of different blocks are said to be "peer" when they have the same rank j in these blocks.

More specifically, in this example, the memory plane comprises, by analogy with the double pairs of bit lines, m double pairs of additional bit lines, namely for the column of rank j illustrated, the pair of additional bit lines GBLTP and GBLTN and the pair of additional bit lines GBLFP and GBLFN.

The memory plane also comprises m second additional memory cells associated with each block and respectively contained in the m modules $MX_i$ associated with said block $BLC_i$.

Figure 8:
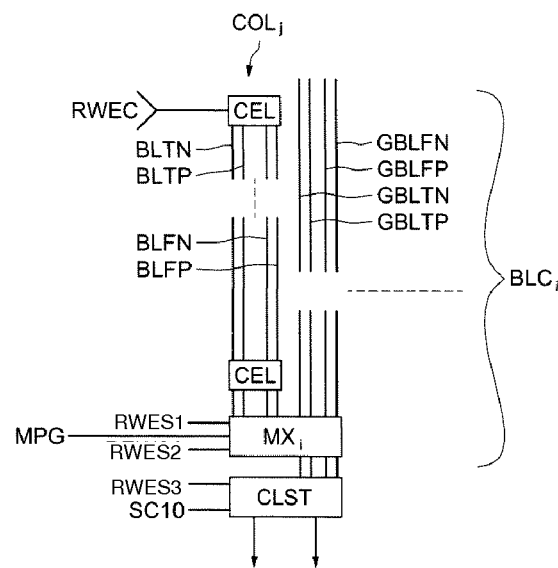

Each second additional memory cell CLS2 (FIG. 9) has a structure identical to that of said additional memory cell CLS1 connected as illustrated in FIG. 8, at the bottom of the column $COL_j$, to the bit lines BLFN, BLFP, BLTN, BLTP.

Figure 9:
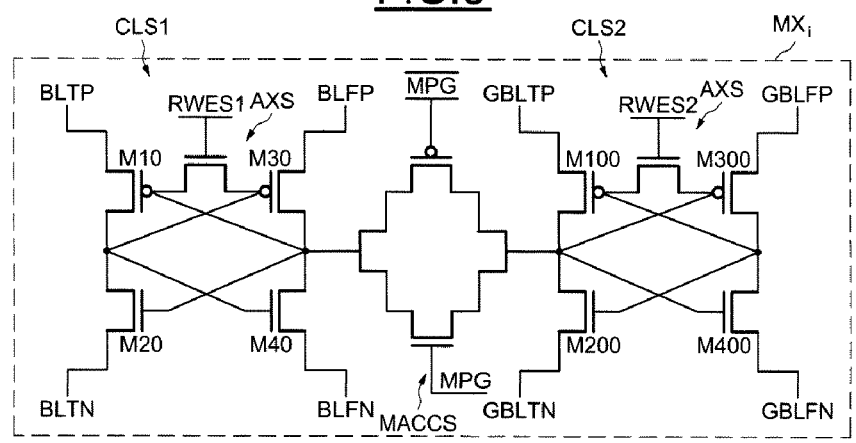

However, as illustrated in FIGS. 8 and 9, each second additional memory cell is connected to the double pair of additional bit lines GBLFN, GBLFP, GBLTN, GBLTP.

Moreover, each second additional memory cell CLS2 is connected to the corresponding additional memory cell CLS1 by additional access means MACCS. These additional access means MACCS in this case comprise an NMOS transistor and a PMOS transistor in parallel, respectively controlled on their gate by the control signal MPG and its complement.

Thus, the additional access means MACCS have a first state (switch open) in which they prohibit any access between the additional memory cell CLS1 and the second additional memory cell CLS2, and a second state (switch closed) in which they allow access to each of the two cells so as to store a datum therein or extract a datum therefrom, and vice versa.

The structure of the additional memory cell CLS1 is identical to that of the cell CLS of FIG. 3. The four transistors of this cell are referenced M10, M20, M30, M40 and the access transistor AXS is controlled by the control signal RWES1.

The operation of this cell CLS1 with regard to the writing of a datum read from a memory cell of the column, or else the reading of a datum from this cell CLS1 with a view to it being written into a memory cell of the column, is identical to what has been described previously.

The four transistors of the memory cell CLS2 are referenced M100, M200, M300, M400 and the access transistor AXS is controlled by the control signal RWES2.

The connections of this cell CLS2 to the additional bit lines GBLFN, GBLFP, GBLTN, GBLTP are identical to those of the cell CLS1 (and of the cell CLS of FIG. 3) to the bit lines BLFN, BLFP, BLTN, BLTP.

The read mode and the write mode of this cell CLS2 are functionally identical to what was described with reference to FIG. 3.

In this respect, the additional bit lines GBLFN, GBLFP, GBLTN, GBLTP are designed to be precharged by precharging means MPCH2 that are identical to the precharging means MPCH of the bit lines.

The memory plane PM also comprises m terminal additional cells CLST, each having a structure identical to that of each second additional memory cell CLS2, respectively connected to the m double pairs of additional lines of bits GBLFN, GBLFP, GBLTN, GBLTP.

Figure 10:
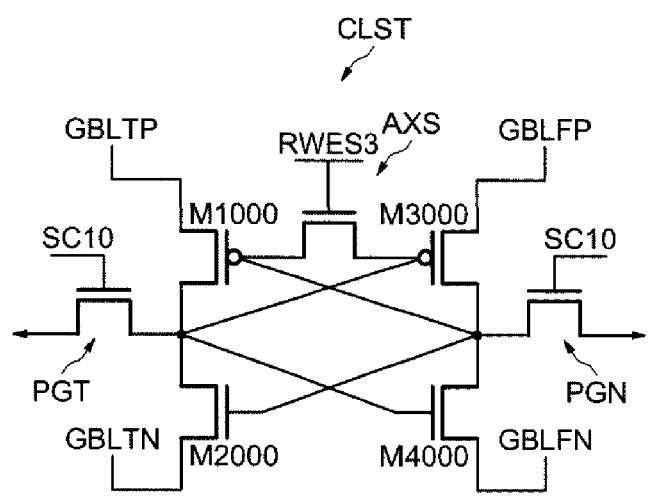

More specifically, as illustrated in FIG. 10, the four transistors of this cell CLST are referenced M1000, M2000, M3000 and M4000 and the access transistor AXS is controlled by the control signal RWES3.

There are also provided terminal additional access means PGT, PGN that can be controlled by the control signal SC10 and connected to each terminal additional cell CLST. These terminal additional access means PCT, PGT are, for example, identical to the means PGT and PGN connected to the memory cell CLS of FIG. 3.

Thus, these terminal additional access means PCT, PGT have a first state to prevent access to the terminal additional cell CLST and a second state to allow access to the terminal additional cell so as to store a datum therein or extract a datum therefrom.

In the device of FIGS. 7 to 10, the second control means MC2 are configured to deliver, when the additional access means MACCS are in their first state, the first control signal RWEC to the gates of the access transistors of all the memory cells CEL of one and the same line of a block $BLC_i$ and the second control signal RWES1 to the gate of the access transistor of all the additional memory cells CLS1 of said block so as to place said memory cells CEL in a read mode and said additional memory cells CLS1 in a write mode, or vice versa.

The device also comprises third control means MC3 configured to deliver, when the additional access means MACCS are in their second state, the control signal RWES1 to the gates of the access transistors of all the additional memory cells CLS1 of said block and the control signal RWES2 to the gates of the access transistors of all the corresponding second additional cells CLS2 so as to place said additional memory cells CLS1 in a read mode and said second additional memory cells CLS2 in a write mode, or vice versa.

Fourth control means MC4 are configured to deliver the control signal SC10 so as to place said terminal additional access means PGT, PGN in their first or in their second state, and fifth control means MC5 are configured to deliver, when the terminal additional access means PGT, PGN are in their first state, the control signal RWES2 to the gate of the access transistor of each second additional memory cell CLS2 associated with a block BLC, and the control signal RWES3 to the gate of the access transistor of each terminal additional memory cell CLST so as to place said second additional memory cells CLS2 in a read mode and said terminal additional memory cells CLST in a write mode, or vice versa.

In FIG. 7, the various means MC1-MC5 were differentiated. That said, at least some of these means can be implemented within one and the same control module, for example by logic circuits.

Figure 11:
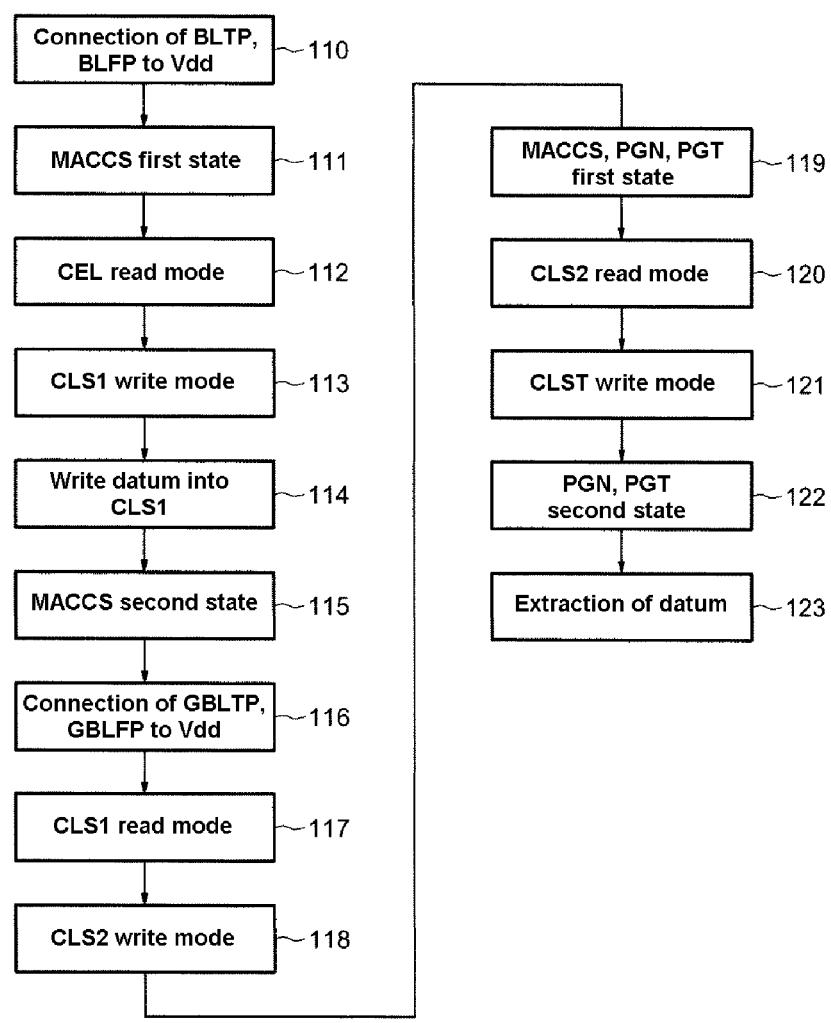

There now follows a description, with reference to FIG. 11, of an exemplary read operation for a group of data contained in a line of memory cells of a block BLC, of the device illustrated in FIGS. 7 to 10.

This read operation comprises a connection 110 of the two lines of bits BLTP, BLFP of each column to the power supply voltage Vdd, the placing 111 of the additional access means MACCS of each additional memory cell CLS1 of said block in their first state, the placing 112 of each memory cell CEL of said line in its read mode and the placing 113 of each additional memory cell CLS1 in its write mode.

The opposite of the datum contained in each memory cell CEL of the line is written (step 114) into the corresponding additional memory cell CLS1.

Then, said additional access means MACCS are placed 115 in their second state.

The two additional bit lines GBLTP and GBLFP of each column are connected to said power supply voltage (step 116). Each additional memory cell CLS1 of said block is placed 117 in its read mode and each second additional memory cell CLS2 associated with said block is placed 118 in its write mode.

The opposite of the datum contained in each additional memory cell CLS1 is written into the corresponding second additional memory cell CLS2.

The additional access means MACCS and the terminal additional access means PGN, PGT are placed (step 119) in their first state.

Each second additional memory cell CLS2 associated with said block BLC, is placed 120 in its read mode, and each terminal additional memory cell CLST is placed 121 in its write mode.

The opposite of the datum contained in each second additional memory cell CLS2 is written into the corresponding terminal additional memory cell CLST.

Then, the terminal additional access means PGT, PGN are placed (step 122) in their second state and said datum contained in each terminal additional memory cell CLST is extracted 123.

Figure 12:
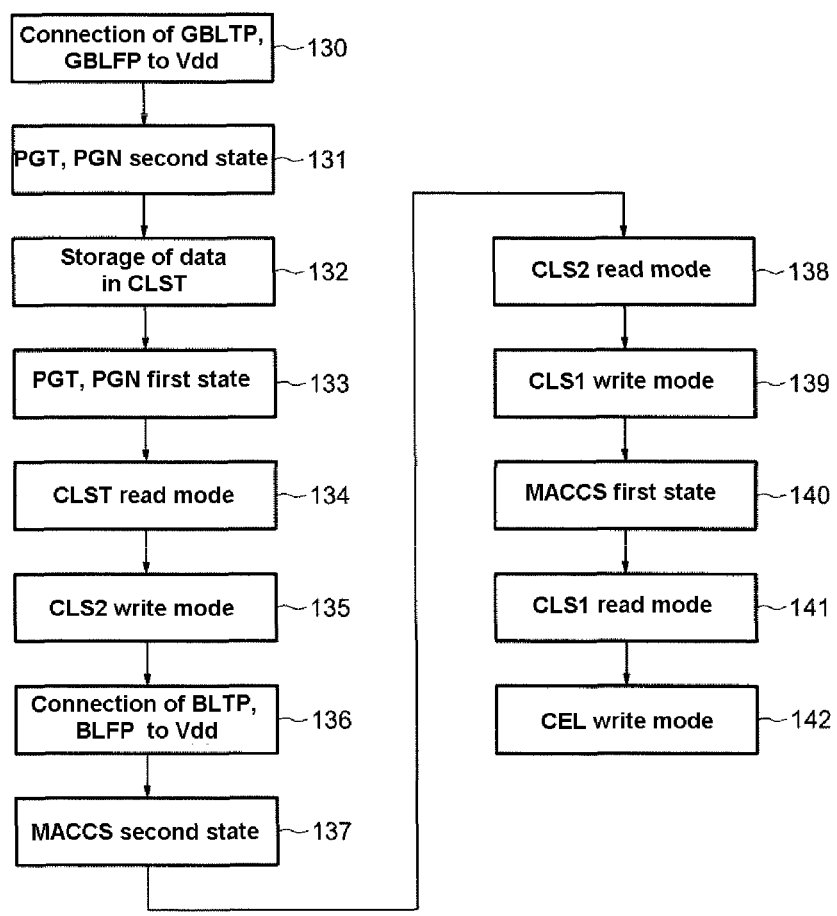

Reference is now made to FIG. 12 to describe an exemplary write operation for a group of data in a line of memory cells of a block BLC, of the device illustrated in FIGS. 7 to 10.

The steps of such a write operation are essentially the reverse steps of those that have just been described for the read operation.

Thus, such a write operation comprises:

a connection 130 of the two additional lines of bits GBLTP, GBLFP of each column to said power supply voltage, the placing 131 of the terminal additional access means PGT, PGN in their second state, the storage 132 of said data of the group in the respective terminal additional memory cells CLST, the placing 133 of the terminal additional access means PGT, PGN and of the additional access means MACCS of said block in their first state, the placing 134 of the terminal additional memory cells CLST in their read mode and the placing 135 of the second additional memory cells CLS2 associated with said block in their write mode, a connection 136 of the two lines of bits BLTP, BLFP of each column of the block to the power supply voltage, the placing 137 of said additional access means MACCS of the block in their second state, the placing 138 of each second additional memory cell CLS2 associated with said block in its read mode and the placing 139 of each corresponding additional memory cell CLS1 in its write mode, the placing 140 of said additional access means MACCS of the block in their first state, the placing 141 of each additional memory cell CLS1 of said block in its read mode and the placing 142 of each memory cell of said line in its write mode.

In the embodiments and implementations that have just been described with reference to FIGS. 7 to 12, when a line has to be written or read, only the modules MXi of the block BLCi that contains said line are affected by these operations. The other memory cells of the other blocks can be in a holding mode (FIG. 7), that is to say with a low power supply voltage, so as to have less leakage.

These embodiments and implementations therefore offer the benefit, unlike the conventional SRAM-type memory plane architectures with 6-transistor cells, of having a low dynamic consumption and of not disrupting the memory cells in holding mode.

Figure 13:
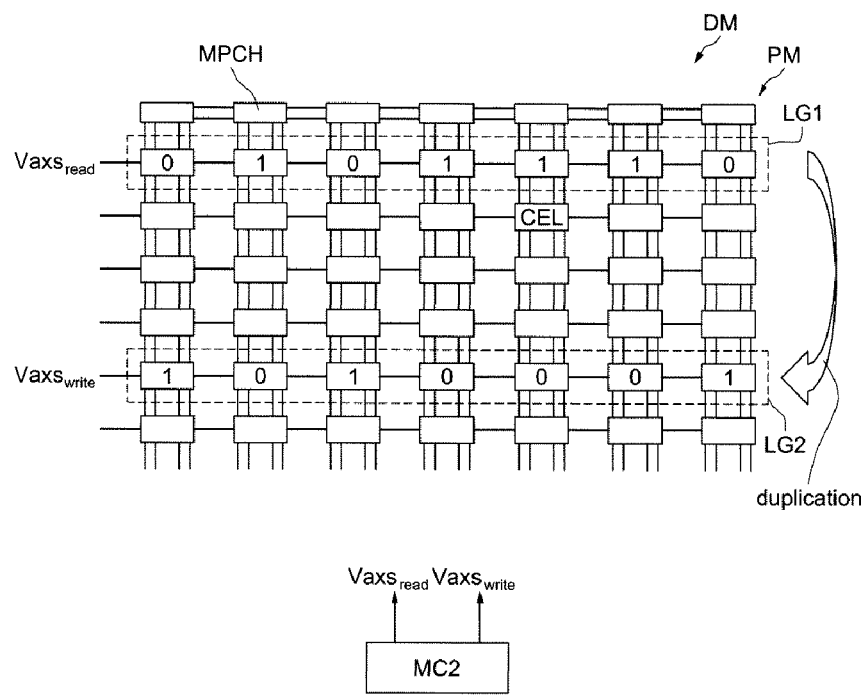
Figure 14:
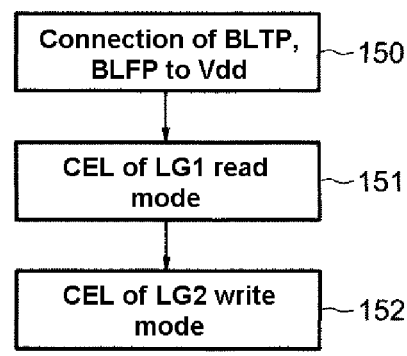

There now follows a description, referring more particularly to FIGS. 13 and 14, of another application of the placing of the memory cells in their read mode or in their write mode.

The operation involves duplicating the content of a line of the memory plane in another line of the memory plane. In this respect there is no need, for such an application, for the memory plane to contain additional memory cells such as, for example, that illustrated in FIG. 3.

More specifically, according to a very general embodiment, the SRAM-type memory device comprises a memory plane PM having at least one column COL of memory cells CEL of the SRAM type comprising two cross-coupled inverters and a single access transistor, each memory cell CEL being connected between two lines of bits BLTP, BLFP without access transistors. According to a general characteristic of this embodiment, the two lines of bits BLTP, BLFP are designed to be powered by a power supply voltage Vdd. The device also comprises control means MC2 configured to deliver a first control signal to the gate of the access transistor of a first memory cell of the column and a second control signal to the gate of the access transistor of a second memory cell of the column so as to place said first memory cell in a read mode and said second memory cell in a write mode, or vice versa.

FIG. 13 illustrates the case where the memory plane comprises a number of columns.

In this case, it is possible to copy, in a single operation and in a single clock cycle, the content of a line, or, more precisely, the opposite of this content, into another line. That said, this copying may also not be synchronous with a clock cycle when it is performed, for example, in response to an asynchronous signal (event signal).

Thus, such a copy operation comprises (FIG. 14) a connection 150 of the lines of bits BLTP, BLFP of each column to the power supply voltage Vdd, the placing 151 of the memory cells of a first line LG1 in their read mode and the placing 152 of the memory cells of a second line LG2 in their write mode.

As explained hereinabove, the placing of the memory cells of a first line in their read mode comprises the application, to the gates of the transistors AXS of these cells, of a voltage $Vaxs_{read}$ equal to a fraction of the power supply voltage, and the application, to the gates of the transistors AXS of the cells of the second line, of a voltage $Vaxs_{write}$ equal to the power supply voltage.

Obviously, the structure of the control means MC2 may be identical to the structure of the control means MC2 described with reference to FIGS. 3 and 6.

The duplicating of lines within the memory plane makes it possible, for example, to make the content of the memory more robust with respect to the corruption of data in a line, and can also find applications in various domains, such as, for example, shift registers and scan chains.

What is claimed is:

1. An SRAM-type memory device, comprising:
    a memory plane having at least one column of memory cells of the SRAM type, each memory cell comprising two cross-coupled inverters and a single access transistor, each memory cell being connected between two bit lines, wherein the at least one column of the memory plane also comprises an additional memory cell, with a structure identical to that of the memory cells of said column, connected to the two bit lines, the two bit lines being configured to be powered by a power supply voltage;
    a controllable additional access means connected to said additional memory cell and having a first state to prevent access to said additional cell and a second state to allow access to said additional memory cell so as to store a datum therein or extract a datum therefrom;
    first control means configured to place said additional access means in said first or in said second state; and
    second control means configured to deliver, when the additional access means is in said first state, a first control signal to a gate of the access transistor of one of the memory cells of the column and a second control signal to a gate of the access transistor of the additional memory cell so as to place said memory cell in a read mode and the additional memory cell in a write mode, or vice versa.

2. The device according to claim 1, wherein the second control means is configured to deliver to the gate of the access transistor of said memory cell a first voltage as a first control signal so as to render this access transistor passing, and to deliver to the gate of the access transistor of said additional memory cell a second voltage as a second control signal so as to render this access transistor passing, so as to place the memory cell in the read mode and the additional memory cell in the write mode when the first voltage is less than the second voltage, and so as to place the memory cell in the write mode and the additional memory cell in the read mode when the first voltage is greater than the second voltage.

3. The device according to claim 1, in which the second control means comprises control modules respectively associated with the memory cells of the column and with the additional memory cell, each control module comprising:
    a port connected between the power supply voltage and ground and comprising a PMOS transistor and an NMOS transistor connected in series, the output of the port being connected to the gate of the access transistor of the corresponding memory cell, and the gates of the PMOS transistor and the NMOS transistor being respectively controlled by a read logic signal and a write logic signal; and
    a second power supply means configured to deliver a second power supply voltage with a value greater than that of said power supply voltage, and connected to the gate of said access transistor via an auxiliary transistor controlled on its gate by the write logic signal.

4. The device according to claim 3, in which the second power supply means comprises a charging pump connected between the power supply voltage and the gate of said access transistor.

5. The device according to claim 1, in which each inverter of each memory cell and of the additional memory cell is connected between one of the two bit lines and another bit line configured to be connected to ground.

6. The device according to claim 1, in which the memory plane comprises a plurality of columns.

7. The device according to claim 6, in which the memory plane comprises:
    p blocks of m columns and of n/p lines, each column of a block comprising said additional cell connected to said two bit lines of the column;
    m pairs of additional bit lines, each pair of additional bit lines being associated with the p related columns of the p blocks;
    m second additional memory cells associated with each block, with a structure identical to that of said additional memory cells, respectively connected to the m pairs of additional bit lines and respectively connected to the m additional memory cells of the corresponding block by said additional access means;

m terminal additional memory cells, each having a structure identical to that of each second additional memory cell, respectively connected to the m pairs of additional bit lines, wherein the second control means is configured to deliver, when the additional access means is in a first state, a first control signal to the gates of the access transistors of all the memory cells of one and the same line of a block and a second control signal to the gate of the access transistor of all the additional memory cells of said block so as to place said memory cells in a read mode and said additional memory cells in a write mode, or vice versa;

third control means configured to deliver, when the additional access means are in said second state, a first control signal to the gates of the access transistors of all the additional memory cells of said block and a second control signal to the gates of the access transistors of all the corresponding second additional cells so as to place said additional memory cells in a read mode and said second additional memory cells in a write mode, or vice versa;

controllable terminal additional access means connected to each terminal additional memory cell and having a first state to prevent access to each terminal additional memory cell and a second state to allow access to each terminal additional memory cell so as to store a datum therein or extract a datum therefrom;

fourth control means configured to place said terminal additional access means in said first or second state; and fifth control means configured to deliver, when the terminal additional access means is in said first state, a first control signal to the gate of the access transistor of each second additional memory cell associated with a block and a second control signal to the gate of the access transistor of each terminal additional memory cell so as to place said second additional memory cells in a read mode and said terminal additional memory cells in a write mode, or vice versa.

8. An SRAM-type memory device, comprising:

a memory plane having at least one column of memory cells of the SRAM type, wherein each memory cell is connected between two bit lines and comprises two cross-coupled inverters and a single access transistor, wherein the two bit lines are directly connected to the cross-coupled inverters of each memory cell and are configured to be powered by a power supply voltage; and control means configured to deliver a first control signal to the gate of the access transistor of a first memory cell of the column and a second control signal to the gate of the access transistor of a second memory cell of the column so as to concurrently place said first memory cell in a read mode and said second memory cell in a write mode, or vice versa.

9. The device according to claim 8, in which the control means is configured to deliver, to the gate of the access transistor of said first memory cell a first voltage as a first control signal so as to render this access transistor passing, and to deliver, to the gate of the access transistor of said second memory cell a second voltage as a second control signal so as to render this access transistor passing, so as to place the first memory cell in the read mode and the second memory cell in the write mode when the first voltage is less than the second voltage, and so as to place the first memory cell in the write mode and the second memory cell in the read mode when the first voltage is greater than the second voltage.

10. The device according to claim 8, in which the control means comprises control modules respectively associated with the first memory cell of the column and with the second memory cell of the column, each control module comprising a port connected between the power supply voltage and ground and comprising a PMOS transistor and an NMOS transistor connected in series, an output of the port being connected to the gate of the access transistor of the corresponding memory cell, the respective gates of the PMSO and NMOS transistors of the port being respectively controlled by a read logic signal and a write logic signal; and a charging pump connected between the power supply voltage and the gate of said access transistor via an auxiliary transistor controlled on its gate by the write logic signal.

11. The device according to claim 8, in which each inverter of the first memory cell and of the second memory cell is connected between one of the two bit lines and another bit line configured to be connected to ground.

12. The device according to claim 8 wherein the memory plane comprises a plurality of columns.

13. A method of reading a datum from or writing a datum to a memory cell of a device, the memory cell being connected between two bit lines without access transistors between each of the two bit lines and the memory cell, the device including an additional memory cell with a structure identical to that of the memory cell and also being connected to the two bit lines and further including a memory access component and an additional memory access component, the method comprising:

connecting the two bit lines to a power supply voltage;

placing the additional memory access component of the additional memory cell in a first state;

placing the memory cell in a read mode;

placing the additional memory cell in a write mode;

writing the opposite of the datum contained in said memory cell into said additional memory cell;

placing the additional memory access component in a second state; and extracting said opposite datum from said additional memory cell.

14. The method of claim 13, further comprising:

placing the additional memory access component of the additional memory cell in a second state;

storing said datum in the additional memory cell;

placing the additional memory access component in a first state;

placing the memory cell in a write mode; and placing the additional memory cell in a read mode, the opposite of the datum contained in the additional memory cell being written into the memory cell.

15. A method of reading or writing a group of data contained in a selected line of memory cells of a block of a device having a memory plane of p blocks of m columns of n/p lines of memory cells, each memory cell being connected between two bit lines, each column including an additional memory cell, a second additional memory cell, an additional access component, two additional bit lines, a terminal additional memory cell, and a terminal additional access component, the method comprising:

connecting the two bit lines of each column to a power supply voltage;

placing additional access component of each additional memory cell of said block in a first state;

placing each memory cell of said selected line in a read mode;

placing each additional memory cell in a write mode, the opposite of the datum contained in each memory cell being written into the corresponding additional memory cell;

placing said additional access component in a second state;

connecting the two additional bit lines of each column to said power supply voltage;

placing each additional memory cell of said block in a read mode;

placing each second additional memory cell associated with said block in a write mode, the opposite of the datum contained in each additional memory cell being written into the corresponding second additional memory cell;

placing said additional access component and the terminal additional access component in a first state;

placing each second additional memory cell associated with said block in a read mode;

placing each terminal additional memory cell in write mode, the opposite of the datum contained in each second additional memory cell being written into the corresponding terminal additional memory cell; and placing the terminal additional access component in a second state and extracting said datum contained in each terminal additional memory cell.

16. The method of claim 15 further comprising:

connecting the two additional bit lines of each column to said power supply voltage;

placing the terminal additional access component in a second state;

storing said group of data in respective terminal additional memory cells;

placing the terminal additional access component and the additional access component of said block in a first state;

placing the terminal additional memory cells in a read mode and placing the second additional memory cells associated with said block in a write mode;

connecting the two bit lines of each column of the block to the power supply voltage;

placing said additional access component of the block in a second state;

placing each second additional memory cell associated with said block in a read mode and placing each corresponding additional memory cell in a write mode;

placing said additional access component of the block in a first state and placing each additional memory cell of said block in its read mode; and placing each memory cell of said selected line in its write mode.

17. A method of copying the content of a first line of a memory plane into a second line of the memory plane, the memory plane having at least one column of memory cells of the SRAM type each memory cell comprising two cross-coupled inverters and a single access transistor, each memory cell being connected between two bit lines, and having a control component configured to deliver a first control signal to a gate of the access transistor of a first memory cell of the column and a second control signal to a gate of the access transistor of a second memory cell of the column, the method comprising:

connecting the bit lines of each column to a power supply voltage; and placing the memory cells of a first line of the column in a read mode while placing the memory cells of a second line in the column in a write mode in response to the first and second control signals respectively.

* * * * *